United States Patent [19]

Chiba

[11] 4,193,046
[45] Mar. 11, 1980

[54] PIEZO-ELECTRIC OSCILLATORS WITH AUTOMATIC GAIN CONTROL

[75] Inventor: Tadataka Chiba, Tokyo, Japan

[73] Assignee: Kinsekisha Laboratory, Ltd., Tokyo, Japan

[21] Appl. No.: 957,951

[22] Filed: Nov. 6, 1978

[30] Foreign Application Priority Data

Nov. 8, 1977 [JP] Japan .................. 52-133997

[51] Int. Cl.² .................. H03B 3/02; H03B 5/36
[52] U.S. Cl. .................. 331/109; 331/116 R; 331/160; 331/183
[58] Field of Search ............ 331/109, 116 R, 116 FE, 331/160, 158, 183

[56] References Cited

U.S. PATENT DOCUMENTS

3,982,210  9/1976  Gehrke .................. 331/109

FOREIGN PATENT DOCUMENTS

50-24066  8/1975  Japan .................. 331/116 R

*Primary Examiner*—Siegfried H. Grimm
*Attorney, Agent, or Firm*—Townsend and Townsend

[57] ABSTRACT

A field effect transistor is used in the bias circuit of an oscillation transistor of a piezo-electric oscillator, and a diode is connected between the gate electrode of the field effect transistor and the base electrode of the oscillation transistor with a polarity to pass current from the gate electrode to the base electrode. The source electrode of the field effect transistor is connected to the base electrode of the oscillation transistor and the drain electrode of the field effect transistor is connected to a power source.

12 Claims, 9 Drawing Figures

PIEZO-ELECTRIC OSCILLATORS WITH AUTOMATIC GAIN CONTROL

BACKGROUND OF THE INVENTION

This invention relates to a piezo-electric oscillator, more particularly a piezo-electric oscillator provided with an automatic gain control circuit capable of stabilizing the output voltage and reducing the power consumption of the oscillator.

Conventionally, a piezo-electric oscillator has been proposed which comprises in combination an automatic gain control circuit including a field effect transistor, as shown in FIG. 1 of the accompanying drawing and fully described in Japanese patent publication No. 24066/1975.

In the prior art circuit shown in FIG. 1, a Colpitts type crystal oscillation circuit is constituted by a quartz oscillator element X, serially connected capacitors $C_1$ and $C_2$ and a transistor $Tr_1$, and the DC operating point of the oscillation circuit is determined by bias resistors $R_1$ and $R_2$ and an emitter resistor $R_3$. A DC voltage obtained by amplifying the emitter voltage of the transistor $tr_1$ by an AC amplifier AMP and then rectifying the output thereof by a diode $D_1$ is applied to the gate electrode G of a field effect transistor $Tr_2$ to act as a control voltage. Since the resistance between the source and drain electrodes S and D, that is, the internal resistance of the field effect transistor $Tr_2$ varies depending upon the bias voltage across the gate and source electrodes applied by a resistor $R_4$ connected therebetween, this internal resistance varies and particularly increases as the DC control voltage from the diode $D_1$ increases. Since the output of the oscillation circuit is zero at the time of starting oscillation, the D C control voltage is also zero and consequently the internal resistance of the field effect transistor becomes small, thus increasing the oscillation amplitude. As the oscillation amplitude increases, the DC control voltage also increases to increase the internal resistance of the field effect transistor, thereby automatically controlling the amount of feedback in a manner to obtain a steady state oscillation amplitude.

However, since the amount of feedback is controlled by a parallel circuit comprising the inductance of a coil L connected to the collector electrode of transistor $Tr_1$ and the internal resistance R of the field effect transistor $Tr_2$, the feedback impedance Z and its phase angle $\theta$ are given by the following equations:

$$Z = \frac{1}{\frac{1}{R} + \frac{1}{j\omega L}} = \frac{(\omega L)^2 R + j\omega L R}{R^2 + (\omega L)^2}, \tan\theta = R/\omega L.$$

In this manner, the phase angle $\theta$ of the feedback signal varies depending upon the internal resistance of the field effect transistor. Accordingly, although the oscillator of the type shown in FIG. 1 can automatically control the oscillation amplitude, there is a defect in that its oscillation frequency varies.

Moreover, in the FIG. 1 oscillator, in order to stabilize the output voltage with respect to the power source voltage, it is necessary to stabilize the voltage across bias resistors $R_1$ and $R_2$ of the oscillation circuit and the bias voltage applied to the AC amplifier AMP, requiring the provision of a separate voltage stabilizing circuit. However, the use of the AC amplifier and the voltage stabilizing circuit not only increases the number of the component parts but also increases the power consumption.

SUMMARY OF THE INVENTION

Accordingly, it is an object of this invention to provide an improved piezo-electric oscillator capable of automatically controlling the gain and stabilizing the oscillation frequency.

Another object of this invention is to provide an improved piezo-electric oscillator wherein the current flowing through the piezo-electric oscillator is decreased and the current value is maintained constant, thereby decreasing the aged variation of the oscillation frequency.

Still another object of this invention is to provide a piezo-electric oscillator capable of maintaining the output voltage constant regardless of the variation in the power source voltage, decreasing the number of the component parts and decreasing the power consumption.

According to this invention, there is provided in a piezo-electric oscillator of the type comprising a piezo-electric oscillator element, an oscillation transistor connected to control the oscillation of said oscillator element, and base bias circuit means for driving said oscillation transistor, the improvement wherein the base bias circuit means comprises a field effect transistor having its drain connected to a power source and its gate and source connected in common to the base of the oscillation transistor, and a diode connected between the gate and the base to rectify the oscillation signal being passed to the gate of the field effect transistor.

DESCRIPTION OF THE PREFERRED EMBODIMENTS

Figure 1:
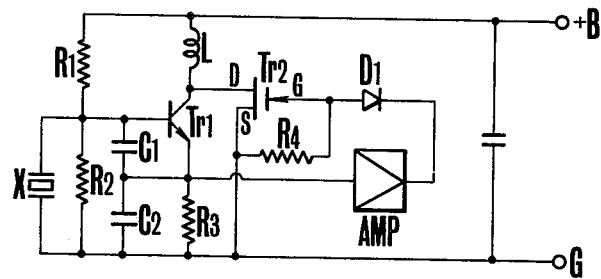
FIG. 1 is a connection diagram showing a prior art piezo-electric oscillation circuit.
Figure 2:
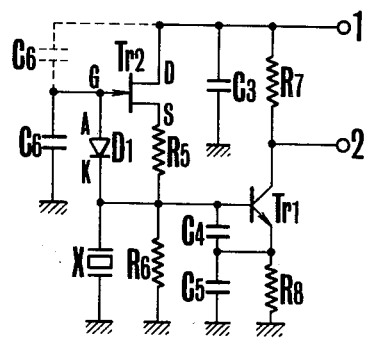
FIG. 2 is a connection diagram of a crystal oscillation circuit showing one embodiment of this invention as applied to a Colpitts type crystal oscillation circuit.

FIG. 2 shows a Colpitts type crystal oscillation circuit embodying the invention in which a bias voltage circuit between a power source terminal 1 receiving a power source voltage of +6 volts, for example, from a power source (not shown) and the base electrode of an oscillation transistor $Tr_1$ (for example, a type 2SC 1044 transistor) is constructed such that the gate electrode G of a field effect transistor $Tr_2$ (for example, a type 2SK 12 transistor) is connected to common junction of the anode electrode A of a diode $D_1$ and a smoothing capacitor $C_6$ (0.01 $\mu$F, for example), while the cathode electrode K of the diode $D_1$ is connected to the base electrode of transistor $Tr_1$ and the other terminal of the capacitor $C_6$ is grounded. The source electrode S of transistor $Tr_2$ is connected to the base electrode of transistor $Tr_1$ via a resistor $R_5$ having a resistance of 1 kiloohm, while the drain electrode D of transistor $Tr_2$ is connected to the power source terminal 1. An AT-cut quartz oscillator element X having an oscillation frequency of 4 MHz is connected between the cathode electrode of diode $D_1$ and ground, and a bias resistor $R_6$ (1.2 kiloohms) is connected between the base electrode of transistor $Tr_1$ and ground. An emitter resistor $R_8$ (200 ohms) is connected between the emitter electrode of transistor $Tr_1$ and ground, and a collector resistor $R_7$ (50 ohms) is connected between the power source terminal 1 and the collector electrode of transistor $Tr_1$. A bypass capacitor $C_3$ (0.01 $\mu$F) is connected between the power source terminal 1 and ground, and serially connected oscillation capcitors $C_4$ and $C_5$ respectively having capacitances of 120 pF and 1500 pF are connected in parallel with the bias resistor $R_6$.

Figure 4:
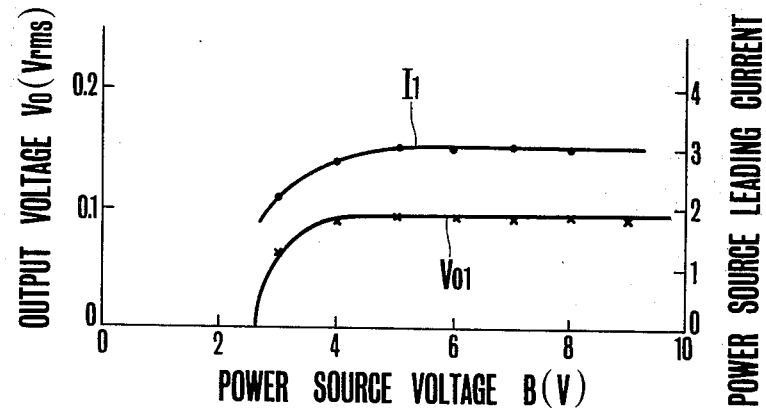
FIG. 4 is a graph showing the relationship of the source voltage B with respect to the output voltage $V_0$ and the power consumption I of the circuits shown in FIGS. 2 and 3.

With the bias circuit shown in FIG. 2, since the field effect transistor $Tr_2$ acts as a constant current circuit for the base bias circuit of the oscillation transistor $Tr_1$, it is possible to maintain the output voltage $V_0$ derived from a terminal 2 at a substantially constant target value of 0.1 volts (r.m.s.) even when the power source voltage B is reduced to 4 volts from the normal voltage of 6 volts (that is a reduction of about 30%) as shown by curve $V_{01}$ in FIG. 4. Furthermore, as shown by curve $I_1$, the power source loading current I is maintained at a substantially constant value of 3 mA for power source voltages above 4 volts.

The current flowing through the quartz oscillator element is also constant like current I even when the power source voltage varies, and measured to be about 450 $\mu$A.

Since the quartz current is stabilized in this manner, the oscillation frequency of the quartz oscillator can be maintained constant even though the power source voltage varies. Moreover, as the current flowing through the quartz is small, the aged variation in the frequency can also be minimized.

Although resistor $R_5$ is adapted to prevent the signal directed to the base electrode of transistor $Tr_1$ from branching to the gate electrode of the field effect transistor $Tr_2$, when the internal resistance of this transistor $Tr_2$ is high (for example, larger than several kiloohms), the resistor $R_5$ may be omitted, thus connecting the source electrode of the field effect transistor $Tr_2$ directly to the base electrode of transistor $Tr_1$. Actually, any stray capacitance associated with the gate electrode of transistor $Tr_2$ may substitute for capacitor $C_6$.

The manner in which automatic gain controlling of the piezo-electric oscillator shown in FIG. 2 is achieved will now be described. The negative half cycle of the oscillation created at the base electrode of the transistor $Tr_1$ at the start of the oscillation is rectified and smoothed out by diode $D_1$ and capacitor $C_6$ so that this negative rectified voltage component is applied to the gate electrode of the field effect transistor. Consequently, as the amplitude of the oscillation appearing at the base electrode of the transistor $Tr_1$ increases, the negative voltage impressed upon the gate electrode of the field effect transistor increases, thus decreasing the source voltage of this field effect transistor. Accordingly, the base current of transistor $Tr_1$ decreases to decrease the amplitude of the oscillation appearing at the base electrode of transistor $Tr_1$ to the normal value. Thus, automatic gain control is accomplished.

As described above, in the quartz oscillator of this invention, automatic gain control is introduced into the bias circuit of the oscillator so that it is possible to stabilize the quartz current and the output voltage against not only an external cause, such as the variation in the power source voltage, but also an internal cause, such as the ageing of the oscillation transistor $Tr_1$. Thus, the circuit provides a highly stabilized oscillation frequency.

Figure 3:
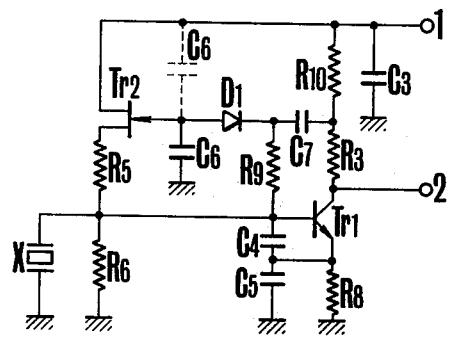
FIG. 3 is a connection diagram showing a modification of the oscillation circuit shown in FIG. 2.

FIG. 3 illustrates another embodiment of this invention showing the application of this invention to a Colpitts type crystal oscillator. The FIG. 3 embodiment differs from the circuit shown in FIG. 2 in that a diode $D_1$ and a resistor $R_9$ (100 kiloohms) are serially connected between the gate electrode of the field effect transistor $Tr_2$ and the base electrode of transistor $Tr_1$, and also in that a capacitor $C_7$ (10 pF) is connected between the cathode electrode of diode $D_1$ and the junction between collector resistors $R_3$ and $R_{10}$ (50 ohms) of transistor $Tr_1$. Since the purpose of resistor $R_9$ is to prevent a signal passing through capacitor $C_7$ from reaching the base electrode of transistor $Tr_1$, it can be replaced by an inductance coil.

With this modified embodiment, the automatic gain control is stronger than in the embodiment shown in FIG. 2. More particularly, the amplitude of the signal appearing at the base electrode of transistor $Tr_1$ is also amplified by the collector resistor $R_3$ and the amplified signal is applied to the diode $D_1$ via capacitor $C_7$, with the result that the degree of automatic gain control is increased by this increased amplification.

The series collector resistors may include more than two resistors. Also, instead of connecting the capacitor $C_7$ to the junction of divided collector resistors $R_3$ and $R_{10}$, the resistor $R_3$ may be omitted so as to connect the capacitor $C_7$ to the junction between the resistor $R_{10}$ and the collector electrode of transistor $Tr_1$.

Figure 5A:
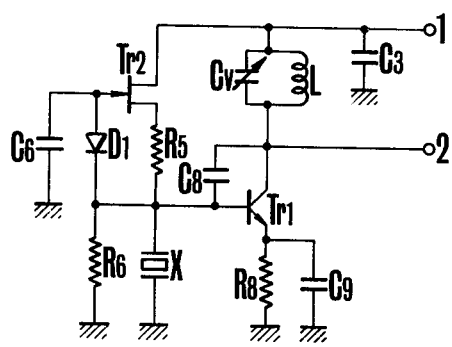
FIGS. 5a and 5b are connection diagrams showing modified embodiments of this invention in which the features of the circuits shown in FIGS. 2 and 3 are applied to Hartley type crystal oscillators, respectively.
Figure 5B:
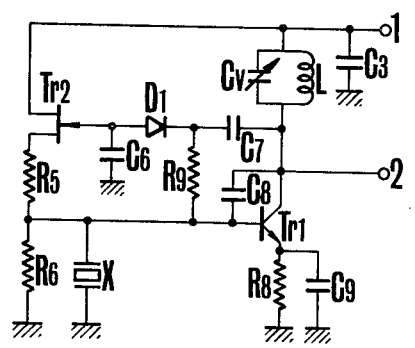

The invention is not limited to the Colpitts type oscillation circuit but can also be applied to Hartley type oscillation circuits as shown in FIGS. 5a and 5b. With reference to these figures, an inductive tuning circuit ($C_V$, L) is connected to the collector electrode of the oscillation transistor $Tr_1$. The circuits shown in FIGS. 5a and 5b will attain similar effects to those of the circuits shown in FIGS. 2 and 3.

Figure 6A:
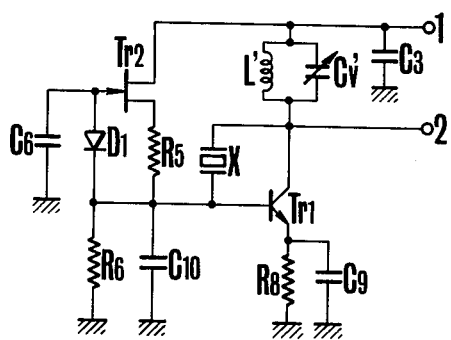
FIGS. 6a and 6b are connection diagrams showing still further modifications of this invention in which the features of the circuits shown in FIGS. 2 and 3 are applied to Colpitts type crystal oscillators.
Figure 6B:
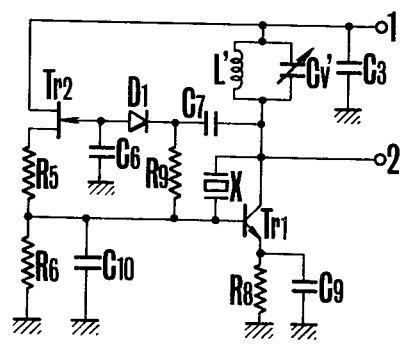

The embodiments shown in FIGS. 6a and 6b are different from those shown in FIGS. 5a and 5b in that in place of inductive tuning circuits, capacitive tuning circuits (L', CV') are used to constitute Colpitts type oscillators, attaining similar effects to those of the circuits shown in FIGS. 2 and 3. Since the principle of the construction of the Colpitts type and Hartley type oscillators are well known in the art, for example, as disclosed in ITT, Reference Data for Radio Engineers, 5th Edition, page 12-19, their description will not be given herein.

Although as the piezo-electric oscillator element, a crystal oscillator is a typical one, other piezo-electric oscillator elements, such as elements made of lithium tantalate, lithium niobate, etc. can also be used. Furthermore, although in the embodiments described above, the output terminal 2 is coupled directly to the collector electrode of the oscillation transistor $Tr_1$, the output terminal may be coupled to the last stage of a multistage amplifier in which case the output terminal may be connected to either the collector or the emitter electrode.

Figure 7:
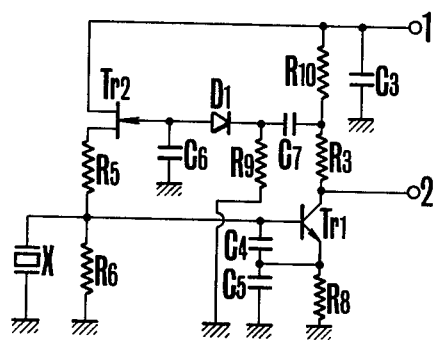
FIG. 7 is a connection diagram showing a modification of the circuit shown in FIG. 3.

In the embodiments shown in FIGS. 3, 5*b* and 6*b*, one end of resistor $R_9$ is connected to the base electrode of transistor $Tr_1$. This connection is possible when the Is (source current) −G (gate voltage) characteristic of the field effect transistor is relatively shallow in the negative side, but where the Is−G characteristic is deep in the negative side, the one end of resistor $R_9$ can be directly grounded as shown in FIG. 7 (which is identical to FIG. 3 except this direct grounding).

Instead of being connected to ground, one end of the capacitor $C_6$ may be connected to the power source as shown at dashed line in FIGS. 2 and 3 to attain another effect than the smoothing effect. Immediately after the application of the power source voltage, the current charging the capacitor $C_6$ flows into the diode $D_1$ to raise the gate potential of the transistor $Tr_2$. As a result, the source potential of the transistor $Tr_2$ is raised to increase the base potential of the transistor $Tr_1$ so that the base current of the transistor $Tr_1$ is increased, thereby facilitating the starting of oscillation.

What is claimed is:

1. In a piezo-electric oscillator of the type comprising a piezo-electric oscillator element, an oscillation transistor connected to control the oscillation of said oscillator element, and base bias circuit means for driving said oscillation transistor, the improvement wherein said base bias circuit means comprises a field effect transistor having a drain connected to a power source and a gate and source connected in common to the base of said oscillation transistor, and a diode connected between said gate and said base to rectify the oscillation signal being passed to the gate of said field effect transistor.

2. The piezo-electric oscillator according to claim 1 wherein said oscillator element is connected between the base of said oscillation transistor and ground.

3. The piezo-electric oscillator according to claim 1 wherein said oscillator element is connected between the base and the collector of said oscillation transistor.

4. The piezo-electric oscillator according to claim 1, 2 or 3 wherein a resistor is connected between the cathode of said diode and the base of said oscillation transistor, and a capacitor is connected between the cathode of said diode and an output terminal which delivers the output signal from said oscillation transistor.

5. The piezo-electric oscillator according to claim 4 wherein said capacitor has one end connected to the cathode of said diode and the other end connected to a junction of at least two serially connected resistors connected to the collector of said oscillation transistor.

6. The piezo-electric oscillator according to claim 4 wherein said capacitor has one end connected to the cathode of said diode and the other end directly connected to the collector of said oscillation transistor.

7. The piezo-electric oscillator according to claim 4 wherein a resistor is connected between the source of said field effect transistor and the base of said oscillation transistor.

8. The piezo-electric oscillator according to claim 4 wherein a capacitor is connected between the anode of said diode and ground.

9. The piezo-electric oscillator according to claim 4 wherein a capacitor is connected between the anode of said diode and said power source.

10. In a piezo-electric oscillator of the type comprising a piezo-electric oscillator element, an oscillation transistor connected to control the oscillation of said oscillator element, and base bias circuit means for driving said oscillation transistor, the improvement wherein said base bias circuit means comprises a field effect transistor having a drain connected to a power source and a source connected to the base of said oscillation transistor, and a diode having an anode connected to the gate of said field effect transistor and a cathode connected to ground for rectifying the oscillation signal being passed to the gate of said field effect transistor.

11. The piezo-electric oscillator according to claim 10 wherein said oscillator element is connected between the base of said oscillation transistor and ground.

12. The piezo-electric oscillator according to claim 10 wherein said oscillator element is connected between the base and the collector of said oscillation transistor.

* * * * *